(12) United States Patent
Pan

(10) Patent No.: US 10,211,802 B2
(45) Date of Patent: Feb. 19, 2019

(54) POSITIONING DEVICE FOR RADIO FREQUENCY MATCHER

(71) Applicant: Jui-Pao Pan, Hsinchu (TW)

(72) Inventor: Jui-Pao Pan, Hsinchu (TW)

(73) Assignee: FairTech Corporation, Hsinchu (TW)

( * ) Notice: Subject to any disclaimer, the term of this patent is extended or adjusted under 35 U.S.C. 154(b) by 0 days.

(21) Appl. No.: 15/256,685

(22) Filed: Sep. 5, 2016

(65) Prior Publication Data

US 2018/0006627 A1    Jan. 4, 2018

(30) Foreign Application Priority Data

Jun. 29, 2016   (TW) .............................. 105209740 A

(51) Int. Cl.
*H03H 7/40* (2006.01)
*H03J 7/16* (2006.01)

(52) U.S. Cl.
CPC ...... *H03H 7/40* (2013.01); *H03J 7/16* (2013.01)

(58) Field of Classification Search
CPC ...................................................... H03H 7/40
USPC .................................. 333/263, 17.3, 32, 33
See application file for complete search history.

(56) References Cited

U.S. PATENT DOCUMENTS

| 5,195,045 A * | 3/1993 | Keane ............... | H01J 37/32082 |
| | | | 315/111.51 |
| 2015/0244342 A1* | 8/2015 | Shimomoto ............ | H03H 7/40 |
| | | | 333/32 |

* cited by examiner

*Primary Examiner* — Stephen E. Jones

(57) ABSTRACT

A positioning device for a radio frequency matcher comprises mainly a micro controller, and at least two detecting elements connected to the micro controller. The detecting elements are disposed on electric motors to detect the rotation angles of the electric motors. When the electric motors adjust the positions of the moving pieces of the tuning elements based on the volume of error signals to change the electrical reactance values so that they may approximately meet the requirement of the radio frequency load and that the radio frequency load may achieve a highest possible power, the micro controller may interpret the signals of the rotation angle detecting elements and output the interpreted values for a user to determine whether the moving pieces of the tuning elements are at right positions to approximately meet the requirement of the radio frequency load and maximize the power of the radio frequency load of the radio frequency matcher.

2 Claims, 4 Drawing Sheets

POSITIONING DEVICE FOR RADIO FREQUENCY MATCHER

BACKGROUND OF THE INVENTION

1. Field of the Invention

The present invention relates to a positioning device for a radio frequency matcher, and particularly to a positioning device for a radio frequency matcher which interprets signals of detecting elements and outputs the interpreted values for a user to determine whether the moving pieces of tuning elements are at right positions to maximize the power of the radio frequency load of the radio frequency matcher.

2. Description of Related Art

As FIG. 1 and FIG. 2 show, a conventional positioning device for a radio frequency matcher usually comprises a detecting unit 1 for detecting radio frequency input A, wherein the detecting unit 1 is connected to two tuning elements for forming radio frequency output B. The two tuning elements are two special tunable electrical reactance elements, tunable capacitance 2 and tunable capacitance 3. The detecting unit 1 is connected to a matching control unit 4. In a transmission path, radio frequency power is divided into transmitted power (Pf) and reflected power (Pr). Optimally, the transmitted power and reflected power ratio is high, which may be achieved if the signal source matches the impedance of the load. It is a purpose of a radio frequency matcher to change the impedance by appropriately adjusting the tuning elements so that the load matches the radio frequency signal source. When a radio frequency signal generator outputs a radio frequency signal, the detecting unit 1 couples the signal with the tuning elements (tunable capacitance 2 and tunable capacitance 3), and finally transmits the signal to the load via the tuning elements (tunable capacitance 2 and tunable capacitance 3). However, because the impedance of the load is variable, there must be occasions when the load does not match the signal source so that the load does not achieve a highest possible power and a power signal that is reflected to the signal source is generated. Therefore, the detecting unit 1 detects the phase error signal and range error signal generated by the transmitted signal and reflected signal, and transmits the two error signals to the matching control unit 4. The matching control unit 4 drives two electric motors 5 and 6 (one drives the tunable capacitance 2 and the other drives the tunable capacitance 3) via a driving unit C based on the volume of the two error signals. The two electric motors 5 and 6 adjust the positions of the moving pieces of the two tuning elements (tunable capacitance 2 and tunable capacitance 3) to change the electrical reactance values of the two elements so that they may approximately meet the requirement of the radio frequency load and that the radio frequency load may achieve a highest possible power. The lower the volume of the two error signals, the easier it is to adjust the tuning elements (tunable capacitance 2 and tunable capacitance 3) to right positions, and the easier it is to achieve resonance.

When the electric motors 5 and 6 of a conventional radio frequency matcher drive the tunable capacitance 2 and tunable capacitance 3, there is no way for a user to know whether they have been adjusted to right positions, and therefore there is no way to determine whether the radio frequency load has achieved a highest possible power. In view of this, after laborious research and experiments, the applicant has devised a positioning device for a radio frequency matcher to maximize the power of the radio frequency load of the radio frequency matcher.

SUMMARY OF THE INVENTION

It is a primary purpose of the present invention to provide a positioning device for a radio frequency matcher which interprets signals of detecting elements and outputs the interpreted values for a user to determine whether the moving pieces of tuning elements are at right positions to maximize the power of the radio frequency load of the radio frequency matcher.

A foregoing positioning device for a radio frequency matcher comprises a micro controller, and at least two detecting elements connected to the micro controller. The detecting elements are disposed on electric motors to detect the rotation angles of the electric motors. When the electric motors adjust the positions of the tuning elements based on the volume of error signals to change the electrical reactance values so that they may approximately meet the requirement of the radio frequency load and that the radio frequency load may achieve a highest possible power, the micro controller may interpret the signals of the detecting elements and output the interpreted values for a user to determine whether the moving pieces of the tuning elements are at right positions to approximately meet the requirement of the radio frequency load and maximize the power of the radio frequency load of the radio frequency matcher.

A foregoing positioning device for a radio frequency matcher, wherein the detecting elements disposed on the electric motors are encoders.

DETAILED DESCRIPTION OF THE PREFERRED EMBODIMENTS

Figure 1:
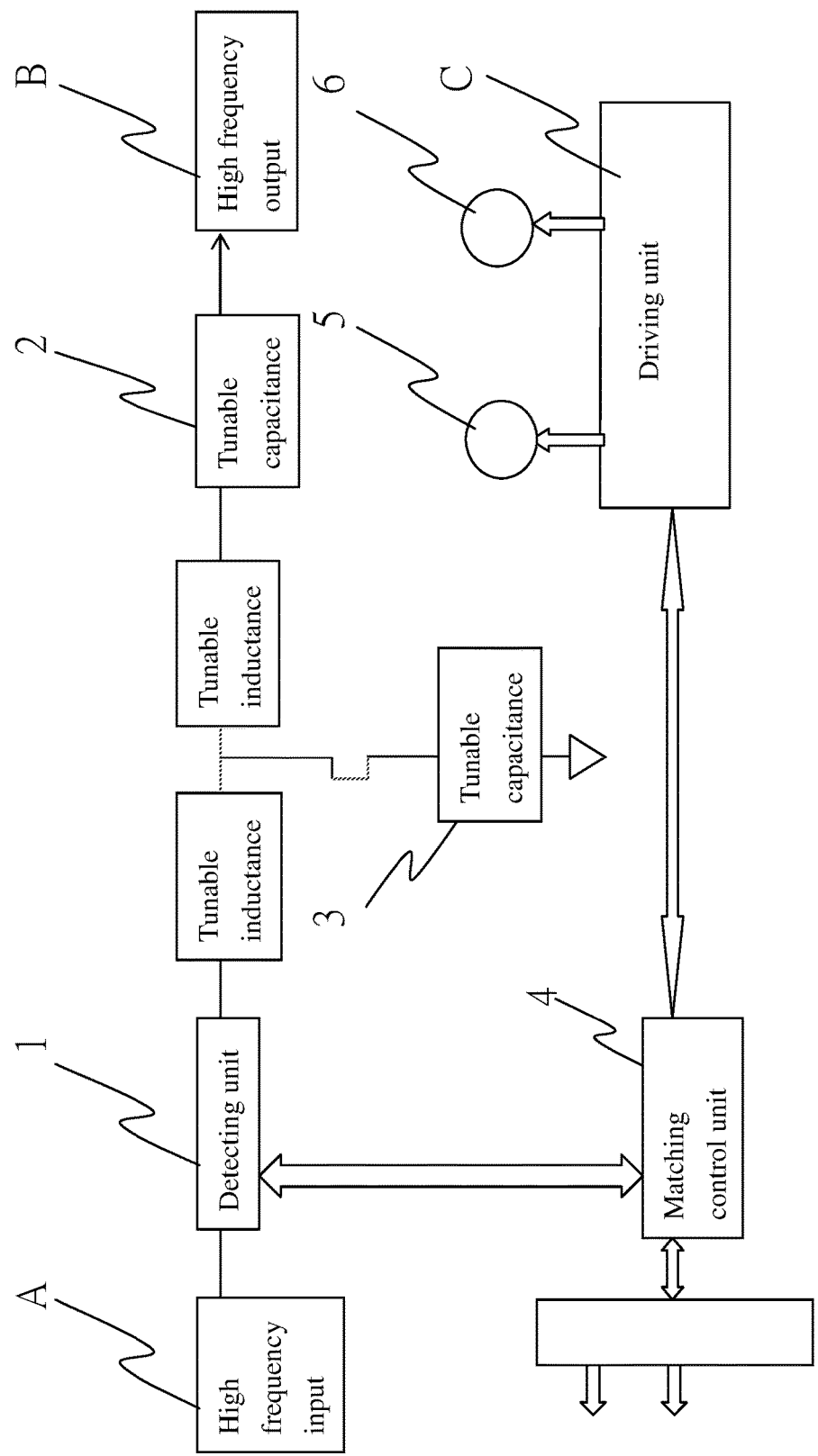
FIG. 1 is a structural drawing of a conventional radio frequency matcher.
Figure 2:
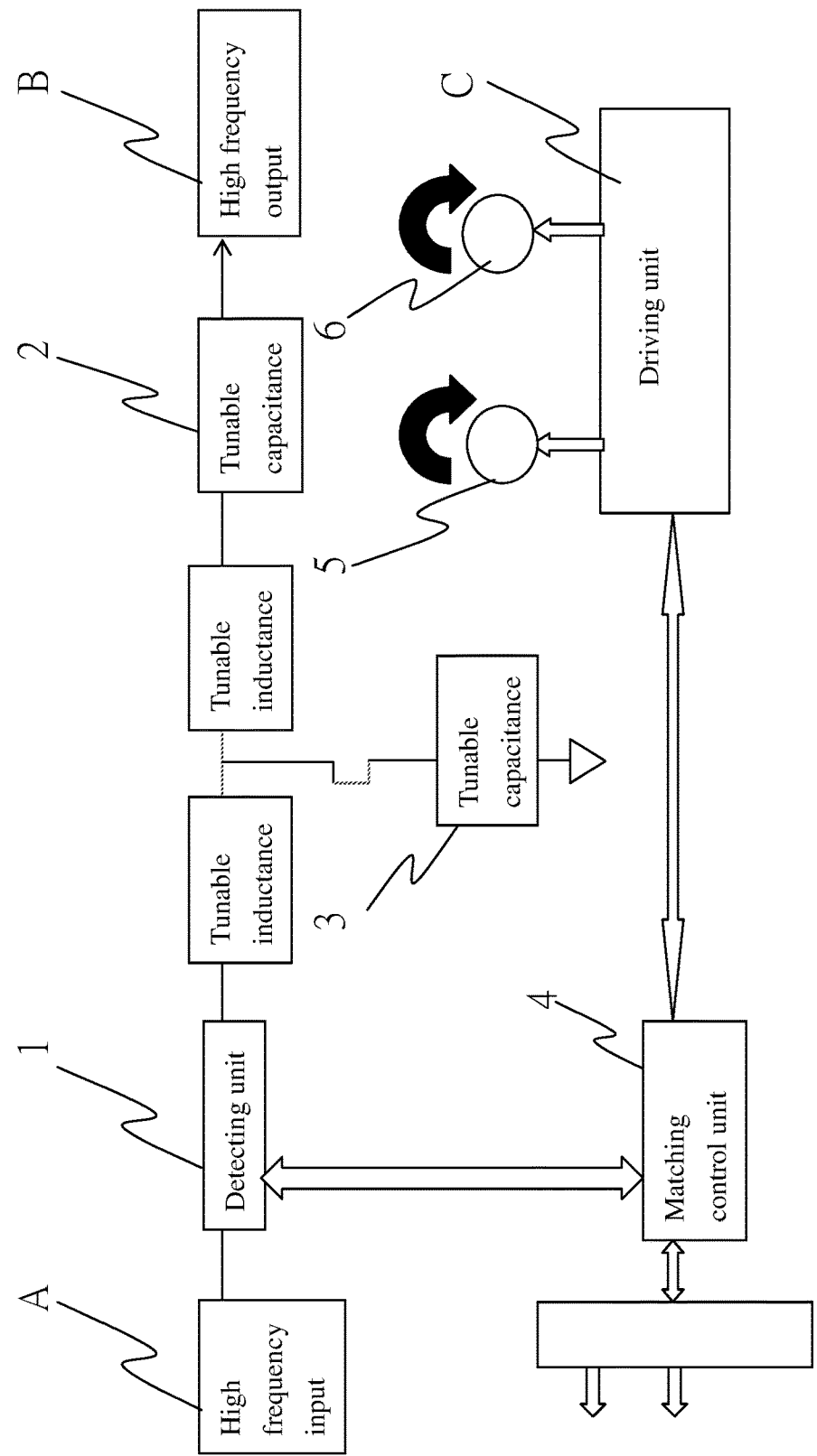
FIG. 2 is a drawing of a conventional radio frequency matcher in operation.
Figure 3:
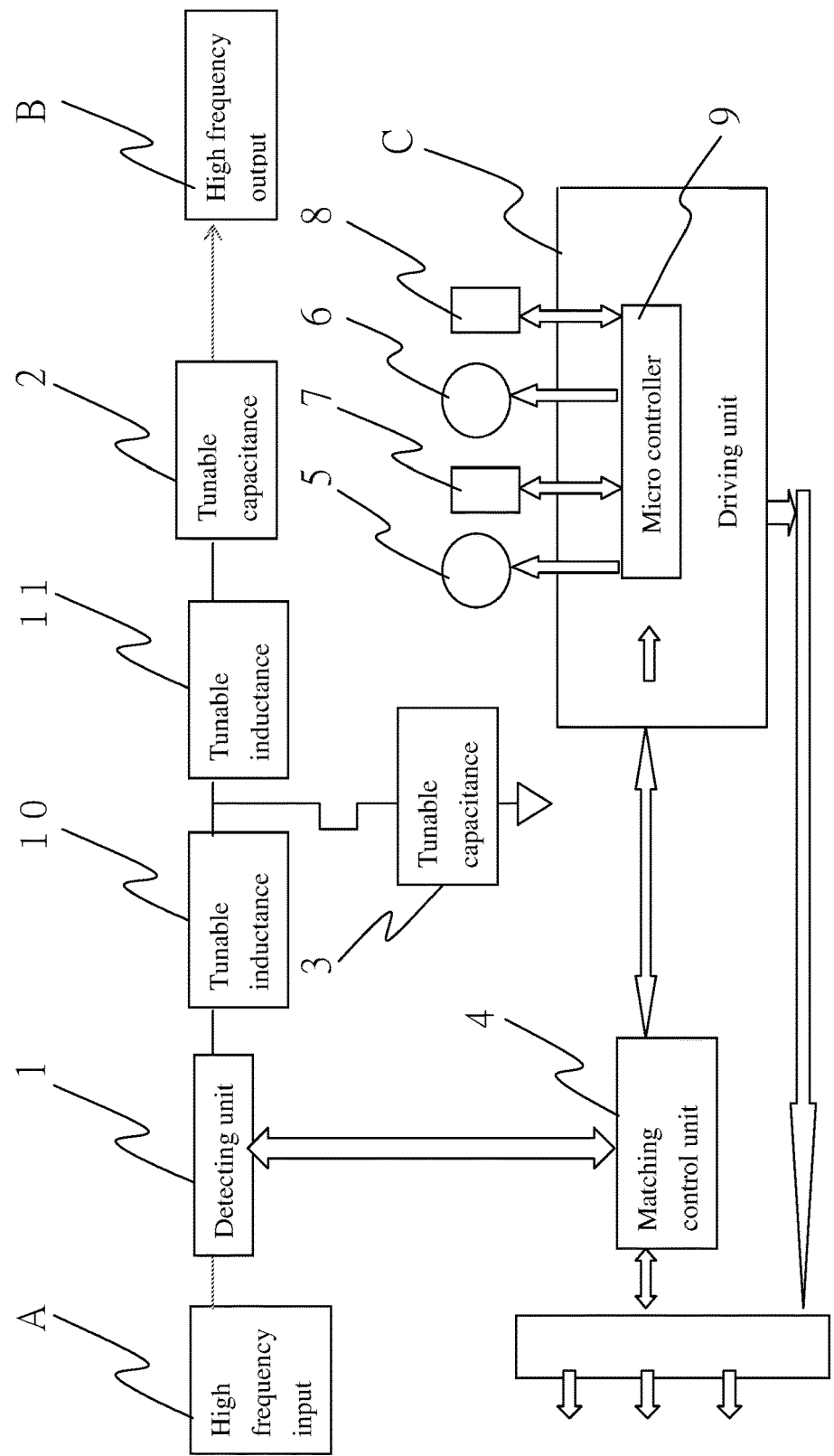
FIG. 3 is a block diagram of an electric circuit of a preferred embodiment according to the present invention.

Please refer to FIG. 3, showing a block diagram of an electric circuit of a preferred embodiment according to the present invention. As the figure shows, same as a conventional radio frequency matcher, the present invention is provided with a detecting unit 1 for detecting radio frequency input A, wherein the detecting unit 1 is connected to two tuning elements for forming radio frequency output B. The two tuning elements are two special tunable electrical reactance elements, tunable capacitance 2 and tunable capacitance 3. The detecting unit 1 is connected to a matching control unit 4. One of the two electric motors 5 and 6 drives the tunable capacitance 2 or tunable inductance 10, while the other drives the tunable capacitance 3 or tunable inductance 11. The electric motors 5 and 6 adjust the positions of the moving pieces of the two tuning elements (tunable capacitance 2 and 3 or tunable inductance 10 and 11) via a driving unit C based on the volume of two error signals to change the electrical reactance values of the two elements, so that they may approximately meet the requirement of the radio frequency load and that the radio frequency load may achieve a highest possible power.

In the present invention, detecting elements 7 and 8 are respectively disposed on the foregoing electric motors 5 and 6. The detecting elements 7 and 8 are connected to a micro controller 9 for detecting the rotation angles of the electric motors. The micro controller 9 is connected to the matching control unit 4. In the present embodiment, the detecting elements 7 and 8 are encoders. When the electric motors 5 and 6 adjust the positions of the moving pieces of the tuning elements (tunable capacitance 2 and 3 or tunable inductance 10 and 11) based on the volume of error signals to change the electrical reactance values of the two elements so that they may approximately meet the requirement of the radio frequency load and that the radio frequency load may achieve a highest possible power, the micro controller 9 may interpret the signals of the detecting elements 7 and 8 and output the interpreted values for a user to determine whether the moving pieces of the tuning elements (tunable capacitance 2 and 3 or tunable inductance 10 and 11) are at right positions to approximately meet the requirement of the radio frequency load and maximize the power of the radio frequency load of the radio frequency matcher.

Figure 4:
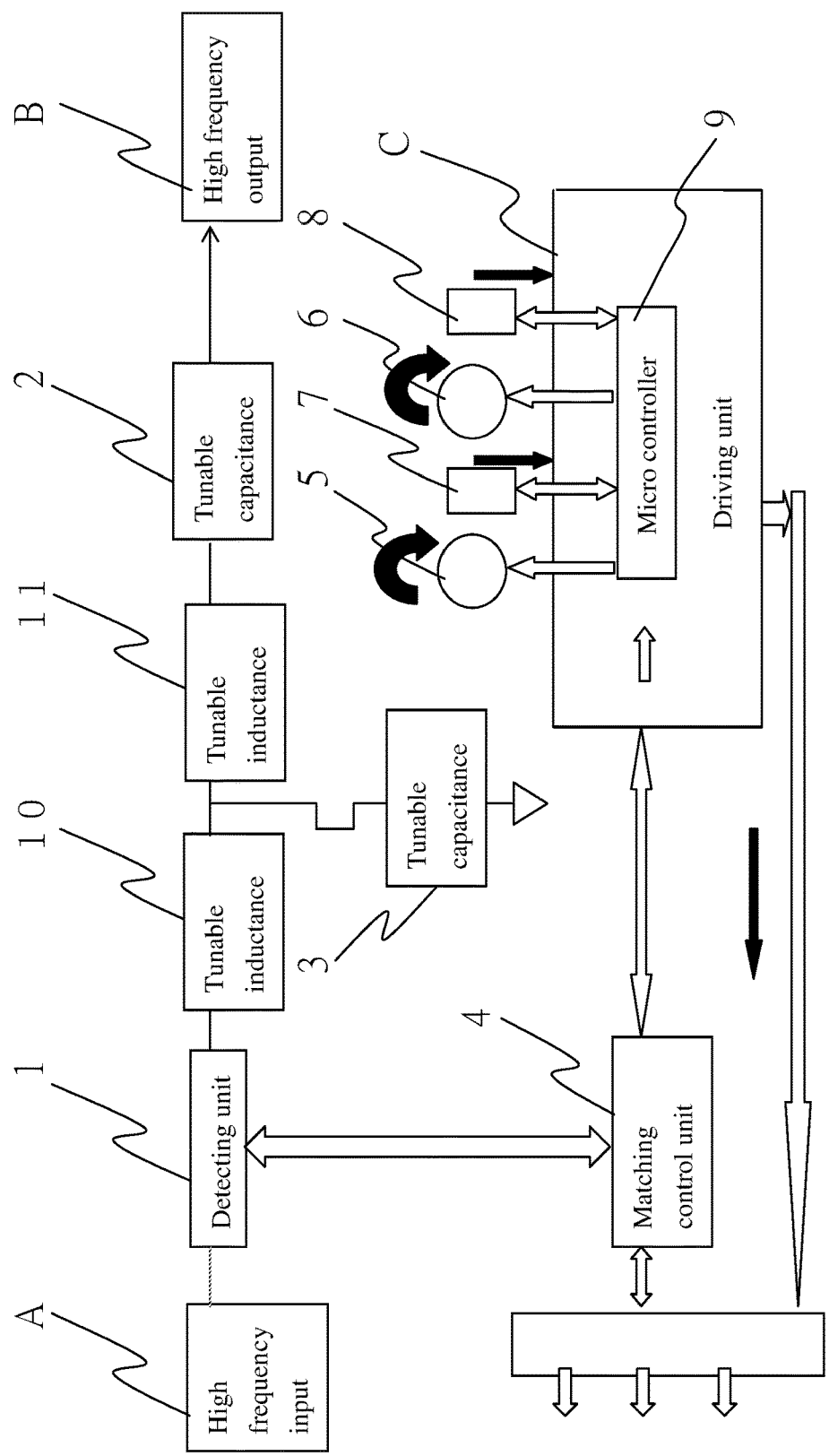
FIG. 4 is a drawing of a preferred embodiment according to the present invention in operation.

Please refer to FIG. 4, showing a drawing of a preferred embodiment according to the present invention in operation. As the figure shows, when the present invention is in operation, when a radio frequency signal generator outputs a radio frequency signal, the detecting unit 1 couples the signal with the tuning elements (tunable capacitance 2 and 3 and tunable inductance 10 and 11), and finally transmits the signal to the load via the tuning elements (tunable capacitance 2 and 3 and tunable inductance 10 and 11). The detecting unit 1 detects the phase error signal and range error signal generated by the transmitted signal and reflected signal, and transmits the two error signals to the matching control unit 4. The matching control unit 4 drives the two electric motors 5 and 6 via a driving unit C based on the volume of the two error signals. When the electric motors 5 and 6 are driven, the detecting elements 7 and 8 constantly detect the rotation angles of the electric motors 5 and 6 and transmit the detected signals to the micro controller 9. The micro controller 9 interprets the signals of detecting elements 7 and 8 and outputs the interpreted values for a user to determine whether the moving pieces of the tuning elements (tunable capacitance 2 and 3 or tunable inductance 10 and 11) are at right positions to approximately meet the requirement of the radio frequency load and maximize the power of the radio frequency load of the radio frequency matcher.

The foregoing preferred embodiments of the present invention are illustrated of the present invention rather than limiting of the present invention. It is intended to cover various modifications and changes included within the spirit and scope of the appended claims, the scope of which should be accorded the broadest interpretation so as to encompass all such modifications and similar structures.

In view of the foregoing, the present invention provides a positioning device for a radio frequency matcher comprising electric motors thereon are disposed detecting elements and a micro controller connected to the electric motors and rotation angle detecting elements. A positioning device for a radio frequency matcher according to the present invention interprets signals of detecting elements and outputs the interpreted values for a user to determine whether the moving pieces of tuning elements are at right positions to maximize the power of the radio frequency load of the radio frequency matcher.

What is claimed is:

1. A positioning device for a radio frequency matcher, comprising:
    a detecting unit for detecting radio frequency input;
    at least two tuning elements for forming radio frequency output, wherein the detecting unit is connected to the tuning elements for forming radio frequency output, the two tuning elements are tunable inductance and tunable capacitance;
    a matching control unit connected to the detecting unit;
    at least two electric motors for driving the tunable inductance and tunable capacitance, wherein the electric motors adjust the positions of moving pieces of the two tuning elements based on the volume of two error signals to change the electrical reactance values of the two tuning elements so that they approximately meet the requirement of the radio frequency load and that the radio frequency load achieves a highest possible power;
    a driving unit having a micro controller connected to the matching control unit; and
    at least two detecting elements disposed on the electric motors, the detecting elements being connected to the micro controller for detecting the rotation angles of the electric motors;
    wherein when the detecting unit detects error signals and range error signals generated by transmitted signals and reflected signals, and transmits the two error signals to the matching control unit, the matching control unit drives the two electric motors via the driving unit based on the volume of the error signals, when the electric motors are driven, the detecting elements constantly detect the rotation angles of the electric motors and transmit the detected signals to the micro controller, the electric motors adjust the positions of the moving pieces of the tuning elements based on the volume of error signals to change the electrical reactance values of the two tuning elements so that they approximately meet the requirement of the radio frequency load and that the radio frequency load achieves a highest possible power, the micro controller interprets the signals of the two detecting elements and output the interpreted values for a user to determine whether the moving pieces of the tuning elements are at right positions to approximately meet the requirement of the radio frequency load and maximize the power of the radio frequency load of the radio frequency matcher.

2. A positioning device for a radio frequency matcher of claim 1, wherein the detecting elements disposed on the electric motors are encoders.

* * * * *